United States Patent [19]

Eklund

[11] Patent Number: 5,087,580

[45] Date of Patent: Feb. 11, 1992

[54] SELF-ALIGNED BIPOLAR TRANSISTOR STRUCTURE AND FABRICATION PROCESS

[75] Inventor: Robert H. Eklund, Plano, Tex.

[73] Assignee: Texas Instruments Incorporated, Dallas, Tex.

[21] Appl. No.: 583,422

[22] Filed: Sep. 17, 1990

[51] Int. Cl.$^5$ .......................................... H01L 21/265
[52] U.S. Cl. ......................................... 437/31; 437/21; 437/32; 437/40; 437/41; 437/44
[58] Field of Search ...................... 437/31, 21, 84, 32, 437/40, 41, 44; 148/DIG. 150

[56] References Cited

U.S. PATENT DOCUMENTS

| | | |
|---|---|---|
| 4,002,501 | 1/1977 | Tamura . |
| 4,753,896 | 6/1988 | Matloubian ......................... 437/84 |
| 4,772,927 | 9/1988 | Saito et al. ........................... 437/21 |
| 4,775,641 | 10/1988 | Duffy et al. ........................... 437/21 |
| 4,863,878 | 9/1989 | Hite et al. . |
| 4,897,703 | 1/1990 | Spratt et al. . |
| 4,899,202 | 2/1990 | Blake et al. . |
| 4,906,587 | 3/1990 | Blake . |

Primary Examiner—Brian E. Hearn
Assistant Examiner—Kevin M. Pilardat
Attorney, Agent, or Firm—Richard A. Stoltz; Rene Grossman; Richard Donaldson

[57] ABSTRACT

A self-aligned bipolar structure for use on SOI (silicon on insulator) substrates is described. This structure does not require etching poly and stopping on single crystal silicon. This is also a process of forming a MOS transistor and a vertical, fully self-aligned bipolar transistor on an insulating substrate. The process comprises: forming an epitaxial silicon layer on an insulator, and etching the epitaxial silicon to form a bipolar mesa and a MOS mesa; forming an oxide surface on the mesas; opening an emitter contact region in the oxide surface of the bipolar mesa; depositing a layer of poly; applying and patterning an etch resist on the poly, thereby providing an exposed portion of the poly on the bipolar mesa; etching the exposed portion of poly using the oxide surface as an etch stop, the etching thereby forming an emitter contact of unetched poly; etching an extrinsic collector portion of the mesa to provide a recessed region; forming a collector-side emitter sidewall and a base-side emitter sidewall on the emitter contact; forming an extrinsic base, using the base-side emitter sidewall to align the extrinsic base to the emitter contact; and forming an extrinsic collector in the recessed region using the collector-side emitter sidewall to align the extrinsic collector to the emitter contact.

5 Claims, 4 Drawing Sheets

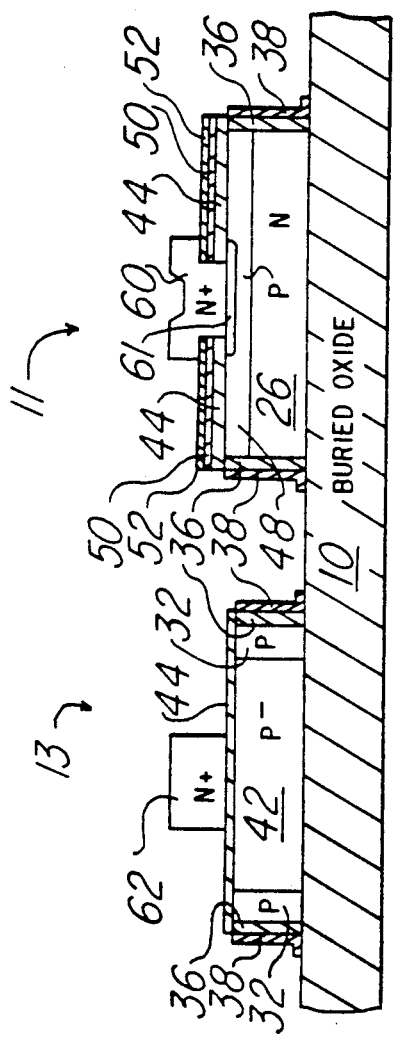

SELF-ALIGNED BIPOLAR TRANSISTOR STRUCTURE AND FABRICATION PROCESS

This invention was made with government support under contract No. SC-0010-87-0021 awarded by Naval Weapons Support Center. The Government has certain rights in this invention.

"BiCMOS/SOI Process Flow", by Robert H. Eklund, (TI-14966) and "SOI BiCMOS Process", by Robert H. Eklund, et al. (TI-14274), both assigned to Texas Instruments.

BACKGROUND OF THE INVENTION

This invention is in the field of integrated circuits, and is specifically directed to methods of fabricating bipolar transistors in integrated circuits.

The integration of MOSFET structures and bipolar transistors on a single substrate has become very desirable. In addition, silicon on insulator (SOI) technology offers the highest performance for a given feature size due to the minimization of parasitic capacitance.

As is well known in the art, digital and linear functions are often performed by integrated circuits using either bipolar or metal-oxide-semiconductor (MOS) technology. Bipolar integrated circuits, of course, provide higher speed operation and greater drive currents than the MOS circuits, at the cost of higher power dissipation, especially when compared against complementary MOS (CMOS) circuits. Recent advances in manufacturing technology have allowed the use of both bipolar and CMOS transistors in the same integrated circuit (commonly referred to as BiCMOS devices).

To date, SOI processes have been CMOS oriented. For bipolar or BICMOS processes in SOI, typical problems have been the defect density caused by the buried oxide layer. Various approaches to SOI bipolar structures have been demonstrated but these approaches suffer from the limitation that they require trench isolation which, in addition to being an expensive process, tends to be a yield limiting process in manufacturing.

Previous bipolar structures that have been proposed for fabricating self-aligned transistors in a thin epitaxial layer have suffered from the drawback that they require that polysilicon be etched while stopping on single crystal silicon. This makes the process difficult to control and tends to result in the structure being quite expensive.

SUMMARY OF THE INVENTION

A self-aligned bipolar structure for use on SOI (silicon on insulator) substrates is described. This structure does not require etching poly and stopping on single crystal silicon. This structure also can be used for a BiCMOS/SOI process without significantly increasing topography.

The described embodiments of the present invention provide bipolar transistors, along with CMOS transistors, on SOI substrates. In the primary described embodiment, the extrinsic base is self-aligned to a sidewall oxide spacer on the emitter poly. After a silicon etch on the collector side and the formation of a second sidewall spacer, the collector contact is self-aligned to the other side of the emitter poly. The collector side silicon etch separates the base and the heavily doped collector contact to prevent degradation of the breakdown voltage for the collector-base junction. It should be noted that this structure does not use a buried layer to minimize collector resistance but accomplishes this by self-aligning the collector contact to the emitter polysilicon.

This is a process of forming a MOS transistor and a vertical, fully self-aligned bipolar transistor on an insulating substrate. The process comprises: forming an epitaxial silicon layer on an insulator, and etching the epitaxial silicon to form a bipolar mesa and a MOS mesa; forming an oxide surface on the mesas; opening an emitter contact region in the oxide surface of the bipolar mesa; depositing a layer of poly; applying and patterning an etch resist on the poly, thereby providing an exposed portion of the poly on the bipolar mesa; etching the exposed portion of poly using the oxide surface as an etch stop, the etching thereby forming a poly emitter; and a base-side emitter sidewall on the emitter contact; forming an extrinsic base, using the base-side emitter sidewall to align the extrinsic base to the emitter contact; etching an extrinsic collector portion of the mesa to provide a recessed region; forming a collector-side emitter sidewall and forming an extrinsic collector in the recessed region using the collector-side emitter sidewall to align the collector contact to the emitter polysilicon.

The method may utilize a first collector-side emitter sidewall and a first base-side emitter sidewall formed prior to etching the extrinsic collector portion, and a second collector-side emitter sidewall and a second base-side emitter sidewall formed after etching the extrinsic collector portion, and the extrinsic base formed using the second base-side emitter sidewall to align the extrinsic base, and the etching of the extrinsic collector portion of the mesa to provide a lower level region aligned to the first collector-side emitter sidewall, and the extrinsic collector in the lower level region formed using the second collector-side emitter sidewall to align the extrinsic collector. In another alternative, the method may utilize a first collector-side emitter sidewall and a first base-side emitter sidewall formed prior to etching the extrinsic collector portion, and a second collector-side emitter sidewall and a second base-side emitter sidewall formed after etching the extrinsic collector portion, and the extrinsic base formed using the first base-side emitter sidewall to align the extrinsic base, and the etching of the extrinsic collector portion of the mesa to provide a lower level region aligned to the first collector-side emitter sidewall, and the extrinsic collector in the lower level region formed using the second collector-side emitter sidewall to align the extrinsic collector.

Preferably, the method utilizes etching to recess the extrinsic collector portion of the mesa but not the extrinsic base, and the method also utilizes patterning the etch resist to provide emitter poly having an area larger than the emitter contact region, thereby creating an emitter-base overlap region, and the method also utilizes TEOS and nitride over the oxide surface in the emitter-base overlap region, whereby capacitance between the emitter contact and the extrinsic base is reduced, and the method also utilizes patterning the etch resist on the poly to provide an exposed negative gate portion of the poly on the MOS mesa; etching the exposed negative gate portion of poly using the oxide surfaces as an etch stop, thereby forming a gate of unetched poly; forming gate sidewalls on the gate; using the gate sidewalls to align source/drain regions to the gate, thereby utilizing a portion of the oxide surfaces as a gate oxide, whereby the oxide surface serves as an etch stop for the poly etch on both the MOS and bipolar mesas and also as a gate oxide.

The invention is also a fully self-aligned bipolar transistor on an insulating substrate, where the transistor comprises: a bipolar mesa on an insulator; an emitter contact on the mesa; a collector-side emitter sidewall and a base-side emitter sidewall on the emitter; an extrinsic base having a common top surface with the mesa aligned to the base-side emitter sidewall; an collector contact portion of the mesa having a top surface below the extrinsic base and mesa top surface, the collector contact portion aligned to the collector-side emitter sidewall. Preferably, the transistor has emitter poly with an area larger than the emitter contact region, thereby creating an emitter-base overlap region and an oxide surface is under the emitter poly in the overlap region and the transistor uses a dielectric (e.g. TEOS layer and a nitride) layer are over the oxide surface in the emitter-base overlap region, whereby capacitance between the emitter and the extrinsic base is reduced.

BRIEF DESCRIPTION OF THE DRAWINGS

FIGS. 2 through 8 are cross sectional views showing the processing steps of a preferred embodiment of the present invention wherein a bipolar transistor, along with an NMOS transistor, is constructed in a single epi layer on top of a buried oxide layer.

DETAILED DESCRIPTION OF THE PREFERRED EMBODIMENTS

The present invention provides substantial advantages in circuits using bipolar transistors and particularly in circuits combining bipolar and CMOS transistors. The disclosed structure does not require that the polysilicon etch stop on single crystal silicon as has been required in prior art. The use of an oxide for the polysilicon etch stop in a fully self-aligned bipolar transistor has apparently never been done before. This structure has the distinct advantage that it is built in the same epitaxial layer 16 as the MOSFET. Another advantage is that this design has improved radiation hardness over prior art due to the reduced epitaxial thickness. One significant advantage of this structure is that the parasitic capacitances are reduced due to the fact that the diffusions extend down to the buried oxide such as for the extrinsic base.

The fabrication of this bipolar structure is described in the context of a CMOS/SOI process thus providing a BiCMOS/SOI process but it could also be used for a bipolar/SOI process. While this transistor structure is primarily suited for use on an SOI substrate, it can be used in a bulk process to avoid having to go through the processing of the buried N+layers. This is very attractive for use in a DRAM process where the substrate is a P-epi on a P+substrate and a buried layer which requires a high temperature cannot be formed. The only special requirement is that the tank depth be greater than the vertical isolation spacing in order to minimize the gain of the parasitic transistor (extrinsic base-tank-substrate). Also, note that the preferred embodiment is described as an NPN but could be built as a PNP.

The proposed structure is not truly self-aligned in that the emitter poly 60 does overlap an oxide 44 slightly but at the current alignment tolerances that steppers have, this is not expected to significantly alter the transistor characteristics.

Figure 1:
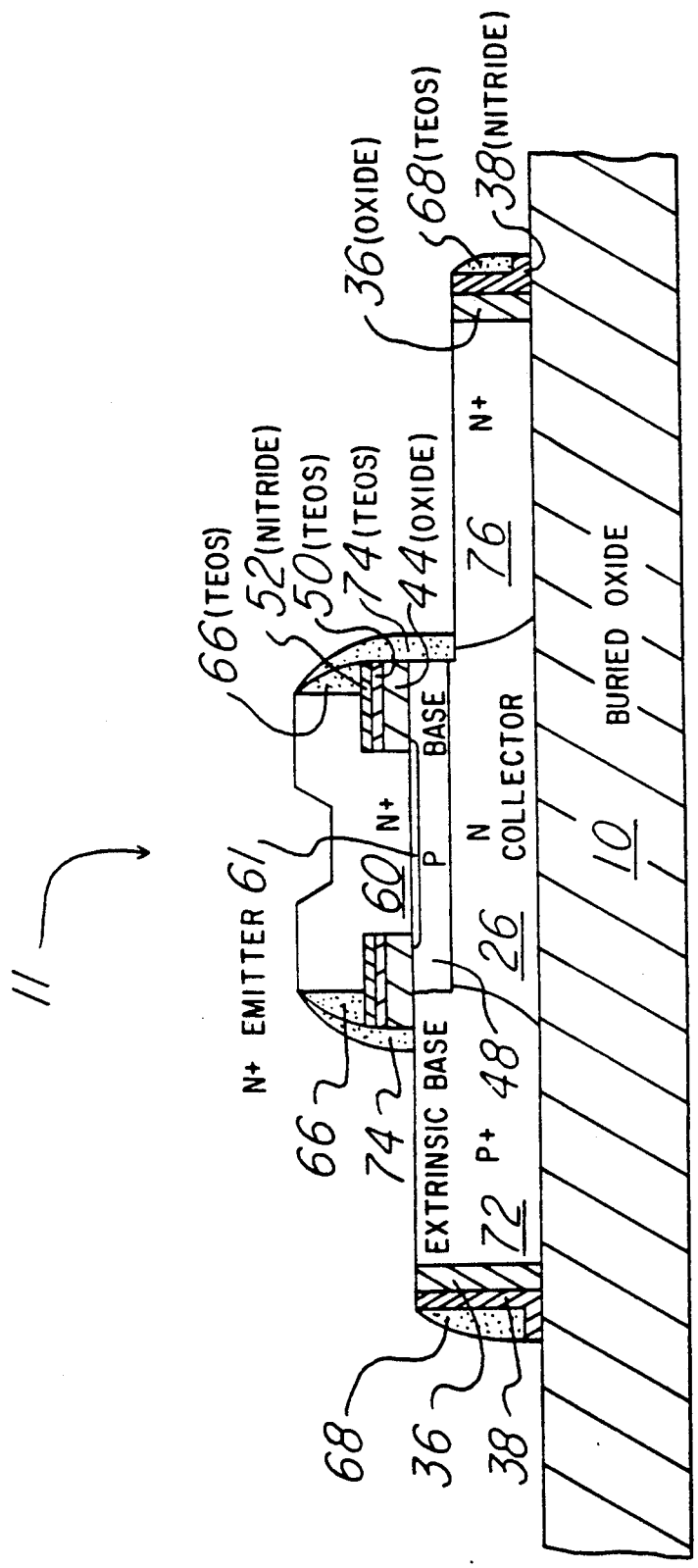
FIG. 1 is a cross sectional view showing a preferred embodiment of the present invention wherein a bipolar transistor is constructed in a single epi layer on top of a buried oxide layer.
Figure 2:
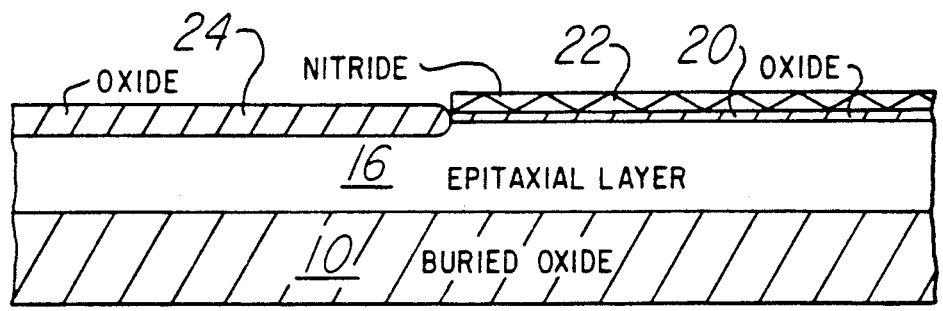

FIGS. 1 through 8 are cross sectional diagrams showing a preferred embodiment of the present invention and method for forming the same. FIG. 1 is a cross sectional view of the bipolar transistor. The bipolar transistor 11 is formed in epi layer 16 which is the same epi layer used to form the NMOS transistor 13. The circuit contains buried oxide layer 10, n- type silicon epi layer (collector) 16, oxide sidewalls 36, nitride sidewalls 38, TEOS sidewalls 68, oxide layer 44, p-type active base 48, TEOS layer 50, nitride layer 52 (layers 50 and 52 are optional to increase dielectric thickness between emitter poly and base), n+polysilicon emitter 60, emitter and gate inner sidewall oxide (TEOS) spacers 66, p+extrinsic base 72 which is self-aligned to sidewall oxide spacer 66 on the emitter poly 60, emitter and gate outer sidewall oxide (TEOS) spacers 74, n+collector contact 76 which is self-aligned to outer sidewall oxide spacer 74 on the side of the emitter poly.

Figure 3:
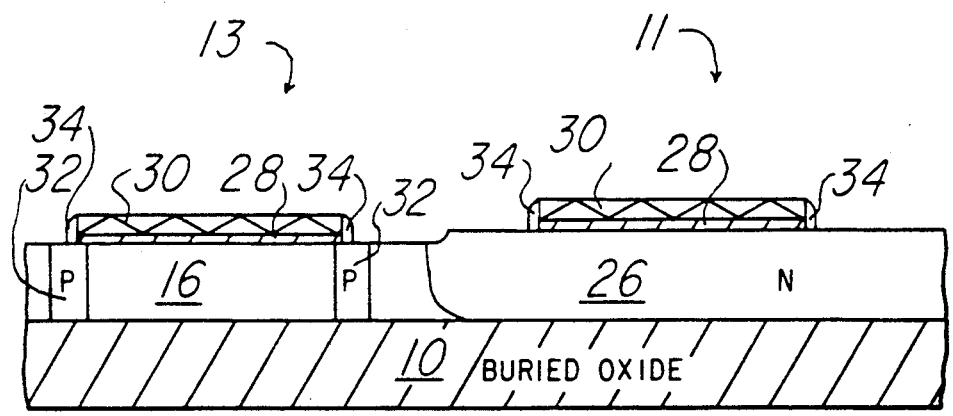

The process for integrating the bipolar npn structure into the 1.0-um CMOS/SOI process flow is shown in FIGS. 2 through 8 where the cross sections of a bipolar 13 and NMOS 11 transistor are shown. The process begins with SOI starting material (buried oxide) 10 that has a 0.6 to 0.8 um epitaxial layer 16 on it. After growing a pad oxide 20 and depositing a 1,000 angstrom nitride layer 22, the inverse of the bipolar collector region is patterned and the nitride is etched. An oxide 24 is grown to reduce the epitaxial thickness to approximately 0.33 um as required by the CMOS transistor design, shown in FIG. 2. After stripping the nitride 22, the bipolar collector 26 is implanted with ions such as phosphorus and annealed. The oxide layer 24 is removed by a wet deglaze. Next, a pad oxide 28 is grown, followed by a 1,400 angstrom nitride 30. The CMOS and bipolar mesas 13 and 11 are now patterned and the oxide/nitride stack is etched. After patterning and implanting ions such as boron (e.g. 0 degrees 1.8E13 cm-2 at 30 KeV and 3.0E13 cm-2 at 80 KeV) to form the NMOS channel stops 32, a 1,000 angstrom TEOS film is deposited, densified, and etched to form a sidewall oxide spacer 34 on the mesa stack, as shown in FIG. 3.

Figure 4:
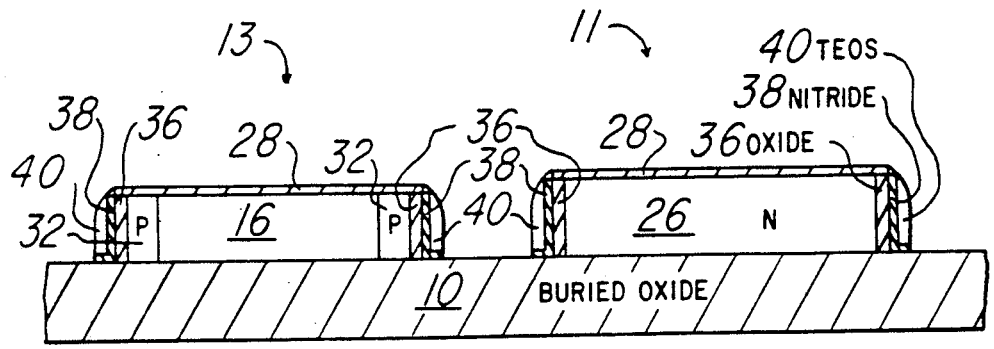

At this point, the silicon etch to form the mesas is performed. After the silicon etch, a 200 angstrom oxidation 36 is done on the mesa sidewall. After a nitride strip, the sidewall formation is completed by means of a 150 angstrom nitride 38 deposition followed by a 1,000 angstrom TEOS 40 deposition and plasma etch to form the sidewall (FIG. 4). The NMOS and PMOS threshold voltage, and tank implants are then patterned and implanted with ions such as boron (e.g. 1.7E12 cm-2 at 25 KeV and 3.5 E12 cm-2 at 80 KeV) for the NMOS threshold voltage and tank, and boron (e.g. 1.0E12 cm-2 at 24 KeV) and phosphorus (e.g. 2.7E12 cm-2 at 180 KeV) for the PMOS threshold voltage and tank.

Figure 5:
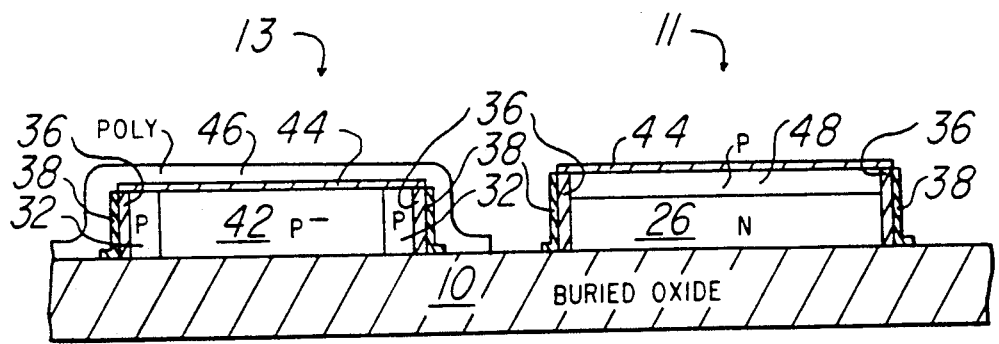
Figure 6:
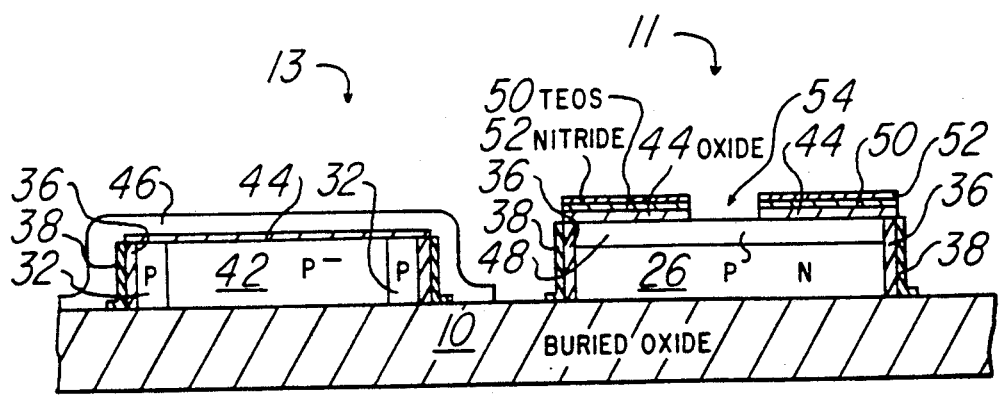

After deglazing the dummy oxide from the mesa surface, a 200 angstrom gate oxide 44 is grown, followed by a 2,000 angstrom polysilicon deposition 46. It should be mentioned that a split polysilicon process is being used so that the MOS gate oxide 44 can be protected while the bipolar base 48 and emitter window 54 are being formed. The base 48 is formed following gate oxidation to limit its junction depth. The bipolar base region 48 is patterned and the polysilicon is removed from this region by a plasma etch. Next, the base of the bipolar transistor, shown in FIG. 5, is implanted through the remaining gate oxide. The base is formed following gate oxidation to limit its junction depth. Next, a 600 angstrom TEOS layer 50 is deposited, followed by a 200 angstrom nitride layer 52. TEOS layer 50 and nitride layer 52 are optional layers which are used to increase dielectric thickness between emitter poly and base. (Although not shown of the figures, these layers can be masked to slightly overlap the edges of the mesa to make alignment less critical.) The emitter contact is patterned so that it opens the emitter window 54 and all CMOS regions but leaves the TEOS/nitride stack 50 and 52 over the rest of the bipolar base region. The first 2,000 angstrom polysilicon film 46 protects the CMOS mesas during the emitter etch. This process has been used for bulk BiCMOS without any GOI (gate oxide integrity) degradation problems. FIG. 6 shows the cross section after the emitter etch.

Next, after a short deglaze, a 2,500 angstrom polysilicon layer is deposited and doped by implantation of ions such as arsenic (e.g. 1E16 cm-2 at 50 KeV) and phosphorus (may be optional) (e.g. 2E15 cm-2 at 80 KeV). This polysilicon layer serves as the bipolar emitter 60 and, in combination with the first polysilicon layer, forms a 4,500 angstrom polysilicon gate 62. Next, the gates and emitters are patterned and the polysilicon is etched, as shown in FIG. 7. After patterning and implanting both p (e.g. boron, 1.0E13 cm-2 at 20 KeV, 0 degrees) and n (e.g. phosphorus, 8.0E13 cm-2 at 80 KeV, 0 degrees) LDDs (lightly doped drains), a 2,500 angstrom TEOS layer is deposited and etched back to form sidewall oxide spacer 66 and 68. Then a 300 angstrom TEOS screen oxide (not shown) is deposited. Next, the p+(not shown) and n+source/drain (S/D) regions 70 are patterned and implanted. For the p+S/D regions, ions such as boron (e.g. 3.0E15 cm-2 at 20 KeV, 0 degrees) are implanted. For the n+S/D regions, ions such as arsenic (e.g. 3.0E15 cm-2 at 150 KeV, 0 degrees) and phosphorus (e.g. 5.0E14 cm-2 at 120KeV, 0 degrees) are implanted The p+S/D implant also forms the extrinsic base 72.

Next, the bipolar collector contact 76 is patterned. After the screen oxide is etched, a shallow silicon etch is performed to recess the heavily doped collector contact 76 below the base region 48. The collector side silicon etch separates the base and the heavily doped collector contact to prevent degradation of the breakdown voltage for the collector-base junction. A 1,000 angstrom TEOS layer is deposited and anisotropically etched to form a second sidewall oxide spacer 74. The bipolar collector contact 76 is then patterned and implanted with ions such as arsenic and phosphorus (optional). This pattern and implant could be combined with the MOS S/D to simplify the process. It should be noted that this structure does not use a buried layer to minimize collector resistance but accomplishes this by self-aligning the collector contact 76 to the emitter 60.

FIG. 8 shows the cross section after the S/D anneal cycle has been completed and the screen oxide has been etched. Titanium disilicide is then used to simultaneously clad all diffusions and gates. Standard multilevel metal processing completes the process flow.

The invention provides a bipolar transistor which has several advantages over prior art. (i) The disclosed design does not require that the polysilicon etch stop on single crystal silicon. (ii) The bipolar transistor is built in the same epitaxial layer as the MOSFET. (iii) This design has improved radiation stability over prior art. (iv) The parasitic capacitances are reduced because the diffusions extend down to the buried oxide such as for the extrinsic base.

Although a specific embodiment of the present invention is herein described, it is not to be construed as limiting the scope of the present invention. For example, the NPN bipolar transistor shown in the preferred embodiment could be built as a PNP bipolar transistor. Also, the preferred embodiment is described for a BiCMOS/SOI process, but the invention could be used for a bipolar/SOI process also. In addition, the process can also be used in bulk processing, rather than with the SOI process. Many embodiments of the present invention will become clear to those skilled in the art in light of the teachings of the specification. The scope of the invention is limited only by the claims appended.

I claim:

1. A process of forming a vertical, fully self-aligned bipolar transistor on a single-crystal silicon surface, said process comprising:
   a. forming an oxide surface on said silicon surface;
   b. opening an emitter contact region in said oxide surface;
   c. depositing a layer of poly;
   d. applying and patterning an etch resist on said poly, thereby providing an exposed portion of said poly;
   e. etching said exposed portion of poly using said oxide surface as an etch stop, said etching thereby forming an emitter contact of unetched poly;
   f. etching an extrinsic collector portion of said silicon surface to provide a recessed region;
   g. forming a collector-side emitter sidewall and a base-side emitter sidewall on said emitter contact;
   h. forming an extrinsic base, using said base-side emitter sidewall to align said extrinsic base to said emitter contact; and
   i. forming an extrinsic collector in said recessed region using said collector-side emitter sidewall to align said extrinsic collector to said emitter contact, wherein the method utilizes etching an extrinsic collector portion of said silicon surface but not an extrinsic base portion, thereby forming a recessed extrinsic collector.

2. The method of claim 1, wherein the method also utilizes patterning said etch resist to provide emitter poly having an area larger than said emitter contact region, thereby creating an emitter-base overlap region.

3. The method of claim 2, wherein the method also utilizes an additional dielectric over said oxide surface in said emitter-base overlap region, whereby capacitance between said emitter poly and said extrinsic base is reduced.

4. The method of claim 1, wherein a MOS transistor is fabricated on said silicon surface, and wherein the method also utilizes patterning said etch resist on said poly to providing an exposed inverse gate portion of said poly, etching said exposed poly down to said oxide surfaces to form a gate of unetched poly, forming gate sidewalls on said gate using said gate sidewalls to align source/drain regions to said gate, whereby a portion of said oxide surfaces is used as a gate oxide, and whereby said oxide surface serves as an etch stop for the poly etch on both the MOS and bipolar silicon surfaces and also as a gate oxide.

5. The method of claim 1, wherein a first collector-side emitter sidewall and a first base-side emitter sidewall are formed prior to etching said extrinsic collector portion, and a second collector-side emitter sidewall and a second base-side emitter sidewall are formed after etching said extrinsic collector portion, with said extrinsic base being doped using said first base-side emitter sidewall to align said extrinsic base, and with said etching of said extrinsic collector portion of said silicon surface to provide a lower level region being aligned to said first collector-side emitter sidewall, and with said extrinsic collector in said lower level region being doped using said second collector-side emitter sidewall to align said extrinsic collector.

* * * * *